(12) United States Patent
Lyons

(10) Patent No.: US 9,772,378 B2
(45) Date of Patent: Sep. 26, 2017

(54) MULTI-STAGE EQUALIZATION

(71) Applicant: Teradyne, Inc., North Reading, MA (US)

(72) Inventor: Timothy Daniel Lyons, Stoughton, MA (US)

(73) Assignee: Teradyne, Inc., North Reading, MA (US)

( * ) Notice: Subject to any disclaimer, the term of this patent is extended or adjusted under 35 U.S.C. 154(b) by 198 days.

(21) Appl. No.: 14/471,726

(22) Filed: Aug. 28, 2014

(65) Prior Publication Data
US 2016/0061926 A1    Mar. 3, 2016

(51) Int. Cl.
*G01R 31/319* (2006.01)

(52) U.S. Cl.
CPC . *G01R 31/31924* (2013.01); *G01R 31/31905* (2013.01)

(58) Field of Classification Search
CPC .......... G01R 31/31709; G01R 31/2834; G01R 31/31924; G01R 31/2889; G01R 1/02; G01R 31/31713; G01R 31/31715; H04L 25/03878; H04L 1/205; H04L 2025/03808
USPC ................. 324/750.01, 537, 750.02, 756.02; 375/226, 371; 333/28 R
See application file for complete search history.

(56) References Cited

U.S. PATENT DOCUMENTS

| | | | |
|---|---|---|---|
| 6,687,311 B1 * | 2/2004 | Zhang ............... | H04L 25/03343 332/103 |
| 6,687,868 B1 | 2/2004 | Furukawa et al. | |
| 7,054,358 B2 | 5/2006 | Yamaguchi et al. | |
| 7,295,642 B2 | 11/2007 | Xu | |
| 7,756,197 B1 * | 7/2010 | Ferguson ............ | H04L 1/24 375/224 |
| 2003/0102939 A1 * | 6/2003 | Humann ............ | H04L 25/03878 333/167 |
| 2004/0125887 A1 | 7/2004 | Dryden et al. | |
| 2005/0125175 A1 | 6/2005 | Murugan et al. | |
| 2005/0131029 A1 | 6/2005 | Hoke et al. | |
| 2006/0047494 A1 | 3/2006 | Tamura et al. | |
| 2006/0252419 A1 | 11/2006 | Liu | |
| 2008/0159460 A1 * | 7/2008 | Kanai ............... | H04L 25/03885 375/373 |
| 2008/0175307 A1 | 7/2008 | Brunn et al. | |
| 2008/0192954 A1 * | 8/2008 | Honji ................ | G10K 15/04 381/86 |

(Continued)

OTHER PUBLICATIONS

International Search Report and Written Opinion mailed Nov. 27, 2015 in international application No. PCT/US2015/046224, 9 pgs.

(Continued)

*Primary Examiner* — Melissa Koval
*Assistant Examiner* — Nasima Monsur
(74) *Attorney, Agent, or Firm* — Choate, Hall & Stewart LLP

(57) ABSTRACT

An example apparatus for interfacing between automatic test equipment (ATE) and a device under test (DUT) includes: multiple stages arranged in sequence between the ATE and the DUT, where each of the multiple stages includes a driver, at least two of the multiple stages each includes a filter, each filter is arranged between two drivers, and each filter is configured to reduce jitter produced by a preceding driver in a signal transmitted between the ATE and the DUT.

20 Claims, 6 Drawing Sheets

(56) References Cited

U.S. PATENT DOCUMENTS

2009/0138760 A1* 5/2009 Moreira ................. G06F 11/24
714/32
2009/0217116 A1 8/2009 Motika et al.
2013/0038136 A1* 2/2013 Wheatley ............. G06K 7/0008
307/104

OTHER PUBLICATIONS

International Search Report for Application No. PCT/US06/ 17873.
Written Opinion for Application No. PCT/U S06/ 17873, mailed Mar. 20, 2007, 10 pages.
International Preliminary Report on Patentability for PCT/US2015/ 046224, 5 pages (Feb. 28, 2017).

* cited by examiner

MULTI-STAGE EQUALIZATION

TECHNICAL FIELD

This specification relates generally to circuitry for performing multi-stage equalization, which may be used, e.g., in a device interface board to automatic test equipment.

BACKGROUND

Automatic Test Equipment (ATE) refers to an automated, usually computer-driven, system for testing devices, such as semiconductors, electronic circuits, and printed circuit board assemblies. A device tested by ATE is generally referred to as a device under test (DUT). ATE typically includes a computer system and a test instrument or a single device having corresponding functionality. ATE is capable of providing test signals to a DUT, receiving response signals from the DUT, and forwarding those response signals for processing to determine whether the DUT meets testing qualifications. Jitter present in test signals from the ATE can affect the quality of the testing performed by the ATE.

SUMMARY

An example apparatus for interfacing between automatic test equipment (ATE) and a device under test (DUT) comprises: multiple stages arranged in sequence between the ATE and the DUT, where each of the multiple stages comprises a driver, at least two of the multiple stages each comprises a filter, each filter is arranged between two drivers, and each filter is configured to reduce jitter produced by a preceding driver in a signal transmitted between the ATE and the DUT.

The example apparatus may include one or more of the following features, either alone or in combination. A last one of the multiple stages may comprise a driver, but not a filter between the driver and the DUT. A last of the multiple stages may comprise a driver and a filter between the driver and the DUT. At least two of the filters may have different configurations, with the different configurations resulting from different corrections required for reduction of jitter. At least one of the filters may comprise a high-pass compensation filter. At least one of the drivers may comprise an AND gate, a splitter, or a combination thereof.

An example apparatus for interfacing between automatic test equipment (ATE) and a device under test (DUT) comprises: a first stage comprising a first driver and a first filter, with the first driver for receiving an initial signal based on an output of the ATE, the first driver for outputting a first output signal based on the initial signal, and the first filter for receiving the first output signal from the first driver and for performing an equalization on the first output signal to produce a first stage signal; a second stage comprising a second driver and a second filter, with the second driver for receiving the first stage signal and for outputting a second output signal based on the first stage signal, and the second filter for receiving the second output signal from the second driver and for performing an equalization on the second output signal to produce a second stage signal; and a third stage comprising a third driver, with the third driver for receiving the second stage signal and for outputting a third output signal based on the second stage signal, and the third output signal being output on a path to the DUT. The example apparatus may comprise one or more of the following features, either alone or in combination.

The third stage may comprise a third filter on the path to the DUT, with the third filter for receiving the third output signal from the third driver and for performing an equalization on the third output signal to produce a third stage signal. The example apparatus may also comprise a fourth stage comprising a fourth driver, with the fourth driver for receiving the third stage signal and for outputting a fourth output signal based on the third stage signal, and with the fourth output signal being output on a path to the DUT. The fourth stage may comprise a fourth filter on the path to the DUT, with the fourth filter for receiving the fourth output signal from the fourth driver and for performing an equalization on the fourth output signal to produce a fourth stage signal.

The example apparatus may comprise a fifth stage comprising a fifth driver, with the fifth driver for receiving the fourth stage signal and for outputting a fifth output signal based on the fourth stage signal, and with the fifth output signal being output on a path to the DUT. The fifth stage may comprise a fifth filter between the fifth stage and the DUT, with the fifth filter for receiving the fifth output signal from the fifth driver and for performing an equalization on the fifth output signal to produce a fifth stage signal that is provided to the DUT.

The first filter may be configured to correct for jitter produced by the first driver, the second filter may be configured to correct for jitter produced by the second driver, the third filter may be configured to correct for jitter produced by the third driver, and the fourth filter may be configured to correct for jitter produced by the fourth driver. At least two of the first driver, the second driver, the third driver, and the fourth driver may have different configurations.

At least one of the first filter and the second filter may comprise a high-pass compensation filter. The first driver may comprise an AND gate or a splitter, and the second driver may comprise an AND gate or a splitter. In some examples, there is no filter between the fifth driver and the DUT. In some examples, there is no filter between the third driver and the DUT.

An example test system comprises: automatic test equipment (ATE) to output test signals to a device under test (DUT); and an interface between the ATE and the DUT, with the interface comprising drivers arranged in sequence and filters arranged among the drivers to perform multi-stage equalization on test signals output from the ATE to the DUT. The example test system may include one or more of the following features, either alone or in combination.

The interface may comprise: multiple stages arranged in sequence between the ATE and the DUT, with each of the multiple stages comprising a driver, at least two of the multiple stages each comprising a filter, each filter being arranged between two drivers, and each filter being configured to reduce jitter produced by a preceding driver in a signal transmitted between the ATE and the DUT.

A last of the multiple stages may comprise a driver but not a filter between the driver and the DUT. At least two of the filters may have different configurations, with the different configurations resulting from different corrections required for reduction of jitter. At least three of the filters may have different configurations, which result from different corrections required for reduction of jitter.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
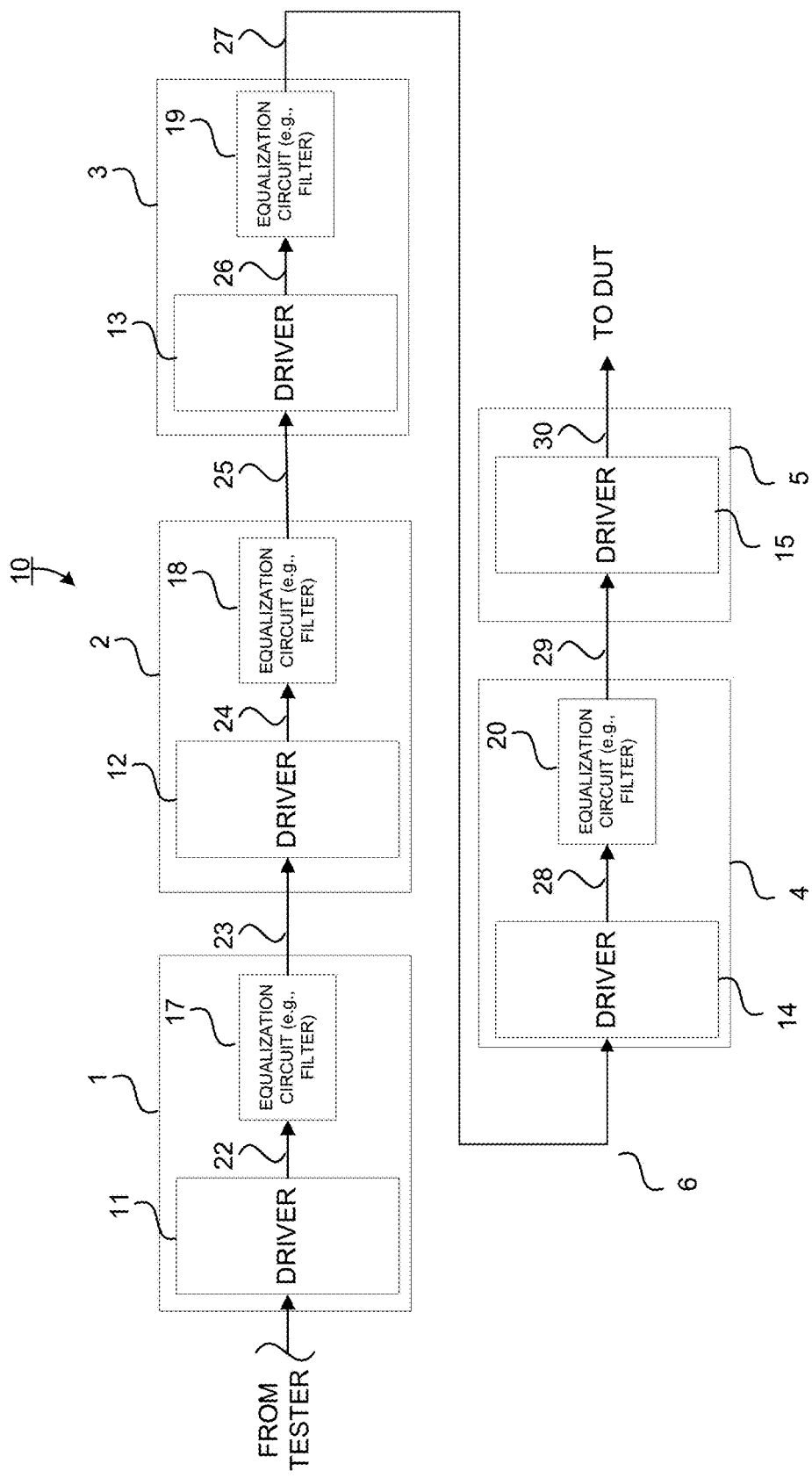
FIG. 1 shows an example of a multi-stage equalization circuit.

Manufacturers may test devices at various stages of manufacturing. In an example manufacturing process, integrated circuits are fabricated in large quantities on a single silicon wafer. The wafer is cut into individual integrated circuits called dice. Each die is loaded into a frame, and bonding wires are attached chip scale packages to connect the die the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT.

Also typically included with ATE is an interface, which may, or may not, be part of a device interface board (DIB). The interface may be configured (e.g., include one or more interfaces) to route signals between the ATE and one or more DUTs. In some implementations, the interface is configured to route signals between one or more ATE and one or more DUTs. In some cases, the interface includes one or more drivers. In this context, a driver generally refers to any type of circuitry that outputs an electrical signal. For example, a logic gate (e.g., an AND gate, an OR gate, etc.), a splitter, an amplifier, or the like, may all be considered drivers because they output signals. Different drivers may introduce different types of jitter into the signals. Jitter can adversely affect testing, since it distorts the signals received by the DUT. Jitter may include, but is not limited to, intersymbol interference, duty cycle distortion, periodic jitter, and random jitter.

Described herein is a multi-stage equalization system that employs equalization circuitry (e.g., frequency domain filters) between different drivers to compensate for (e.g., at least partially correct for) jitter produced by an immediately preceding driver. The equalization circuitry, at each stage, may be customized (e.g., different in each stage) to correct for a particular type and/or magnitude of jitter produced by a preceding driver. By correcting for jitter at each stage, it may be possible to reduce the overall jitter experienced by the DUT at the output of the interface, and thereby provide better quality test signals.

Figure 2:
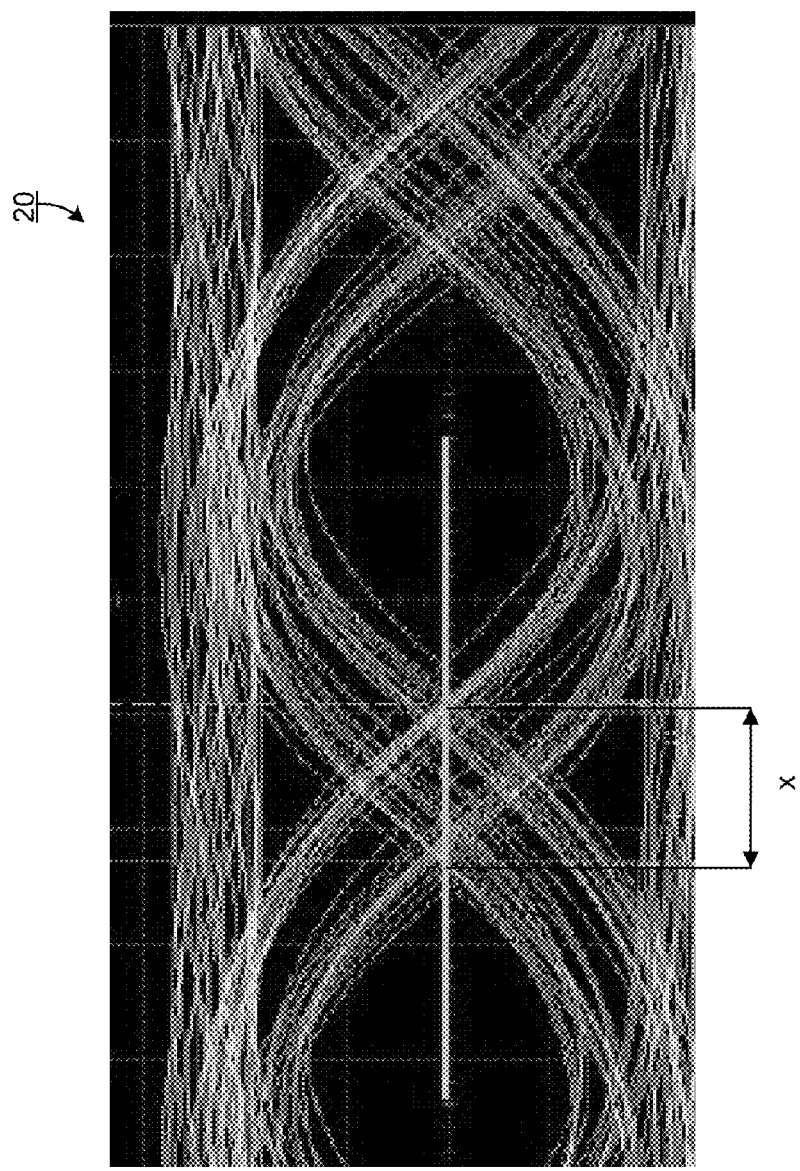
FIG. 2 shows an example of a signal with jitter.
Figure 3:
FIG. 3 shows an example of a signal with less jitter than the signal of FIG. 1

FIG. 1 shows an example of interface circuitry that may be incorporated into a DIB or any other appropriate interface between the DUT and the ATE. In this example implementation, interface 10 includes multiple stages 1, 2, 3, 4, 5 arranged in sequence between the ATE (not shown) and a DUT (not shown). Each of the multiple stages includes a driver 11, 12, 13, 14, 15, and at least two of the multiple stages each includes equalization circuitry, such as a frequency domain filter, arranged between two drivers. In this regard, in FIG. 1, equalization circuits (e.g., equalizers) are shown in the same block (stage) as the drivers; however, this is not intended to imply that they are part of the circuitry that makes up the drivers. For example, in some implementations, the equalizers are external to the driver components. Each filter may be configured to reduce jitter produced by a preceding driver in a signal transmitted between the ATE and the DUT. More generally, the jitter at each stage is the sum of the jitter of the driver component itself, the printed circuit board traces between each component, and the distortion of the input of the next driver. The equalization circuits are intended to correct for the sum of these. For example, reducing the zero crossing width of a signal is one type of jitter reduction that may be performed. For instance, FIG. 2 shows a signal 20 having a zero-crossing width having a value "x", and FIG. 3 shows a signal 21 having reduced jitter with a zero-crossing width that is less than the value "x" of FIG. 2. In this example, the jitter is non-zero, although in some examples the jitter may be reduced to levels that are effectively zero. The reduction of jitter through use of intervening equalization circuits, such as filters, enables multi-stage equalization of test signals.

In the example of FIG. 1, interface 10 includes five drivers 11 to 15. In other implementations, there may be fewer drivers (e.g., two, three, or four) or more drivers (e.g., five, six, seven, and so on) than those shown in FIG. 1. Interface 10 also includes equalization circuits—in this example, frequency domain filters 17, 18, 19, 20 (or, simply, "filters"). Filter 17 is electrically connected between drivers 11 and 12; filter 18 is electrically connected between drivers 12 and 13; filter 19 is electrically connected between drivers 13 and 14; and filter 20 is electrically connected between drivers 14 and 15. In this example implementation, there is no filter electrically connected to the output of driver 15 (e.g., between driver 15 and the DUT), for reasons explained below.

Each of filters 17 to 20 may be configured (e.g., customized) to correct for (e.g., to reduce or otherwise affect) the amount (e.g., type and/or magnitude) of jitter produced by an immediately preceding driver. For example, filter 17 may be configured to reduce the amount of jitter produced by driver 11; filter 18 may be configured to reduce the amount of jitter produced by driver 12; filter 19 may be configured to reduce the amount of jitter produced by driver 13; and filter 20 may be configured to reduce the amount of jitter produced by driver 14. In some implementations, each of filters 17 to 20 may be configured (e.g., customized) to correct for (e.g., to reduce or otherwise affect) the amount (e.g., type and/or magnitude) of jitter produced only by an immediately preceding driver. In some implementations, each of filters 17 to 20 may be configured (e.g., customized) to correct for (e.g., to reduce or otherwise affect) the amount (e.g., type and/or magnitude) the cumulative jitter produced by two or more preceding drivers in signal path 6 (including, e.g., all or part of transmission media and circuitry from the ATE to the DUT). In some implementations, the equalization circuits (e.g., equalizers) can also be configured to partially pre-correct for jitter in succeeding drivers in the chain. In some implementations, there may be a combination of filters between drivers, some of which are configured to reduce the amount of jitter produced only by an immediately preceding driver, and some are which are configured to reduce the cumulative jitter produced by two or more preceding drivers in signal path 6.

In the example of FIG. 1, in first stage 1, first driver 11 receives an initial signal based on an output of the ATE. The first driver outputs a first output signal 22 based on the initial signal. First filter 17 receives the first output signal from the first driver and performs an equalization (e.g., a jitter correction) on the first output signal to produce a first stage signal 23. In second stage 2, second driver 12 receives the first stage signal and outputs a second output signal 24 based on the first stage signal. Second filter 18 receives the second output signal from the second driver and performs an equalization on the second output signal to produce a second stage signal 25. In third stage 3, third driver 13 receives the second stage signal and outputs a third output signal 26 based on the second stage signal. Third filter 19 receives the third output signal from the third driver and performs an equalization on the third output signal to produce a third stage signal 27. In fourth stage 4, fourth driver 14 receives the third stage signal and outputs a fourth output signal 28 based on the third stage signal. Fourth filter 20 receives the fourth output signal from the fourth driver and performs an equalization on the fourth output signal to produce a fourth stage signal 29. In fifth stage 5, fifth driver 15 receives the fourth stage signal and outputs a fifth output signal 30 based on the fourth stage signal. In this example implementation, the fifth output signal 20 is out on a path to the DUT. For example, fifth driver 15 and the DUT may be electrically connected such that fifth driver 15 outputs the fifth output signal 30 directly to the DUT or outputs the fifth output signal along an electrical path to the DUT (where the fifth output signal 30 may pass through one or more other circuit elements and/or transmission media and may be transformed or otherwise processed before reaching the DUT).

In some implementations, as in the example above, there is no equalization circuitry, e.g., no filter, at the output of the last stage 5 (e.g., after driver 15) of the multi-stage equalizer (in the example above, the last stage is the fifth stage, however, there may be any appropriate number of stages in a multi-stage equalizer). This is because the output filters may change the shape and/or amplitude of a driver signal, which may be undesirable from the point of view of the DUT. Accordingly, in some implementations, the jitter produced by the final output stage may be tolerated during testing, particularly since it is typically only fraction of the jitter that would otherwise be produced. Furthermore, not providing a correction at the output can result in improved signal time-domain performance. In this regard, the output of each successive component in the multi-stage equalization chain increases the time domain distortion caused by imperfect drivers and transmission lines. By compensating for the time domain distortions individually with frequency domain filters 17, 18, 19, 20, overall signal distortion can be reduced.

In some implementations, there is circuitry, e.g., a filter, at the output of the last stage of the multi-stage equalizer (in the example above, the last stage is the fifth stage, however, there may be any appropriate number of stages in a multi-stage equalizer). Accordingly, in some implementations, the jitter produced by the final output stage is reduced before that signal is output on a path to the DUT.

Figure 4:
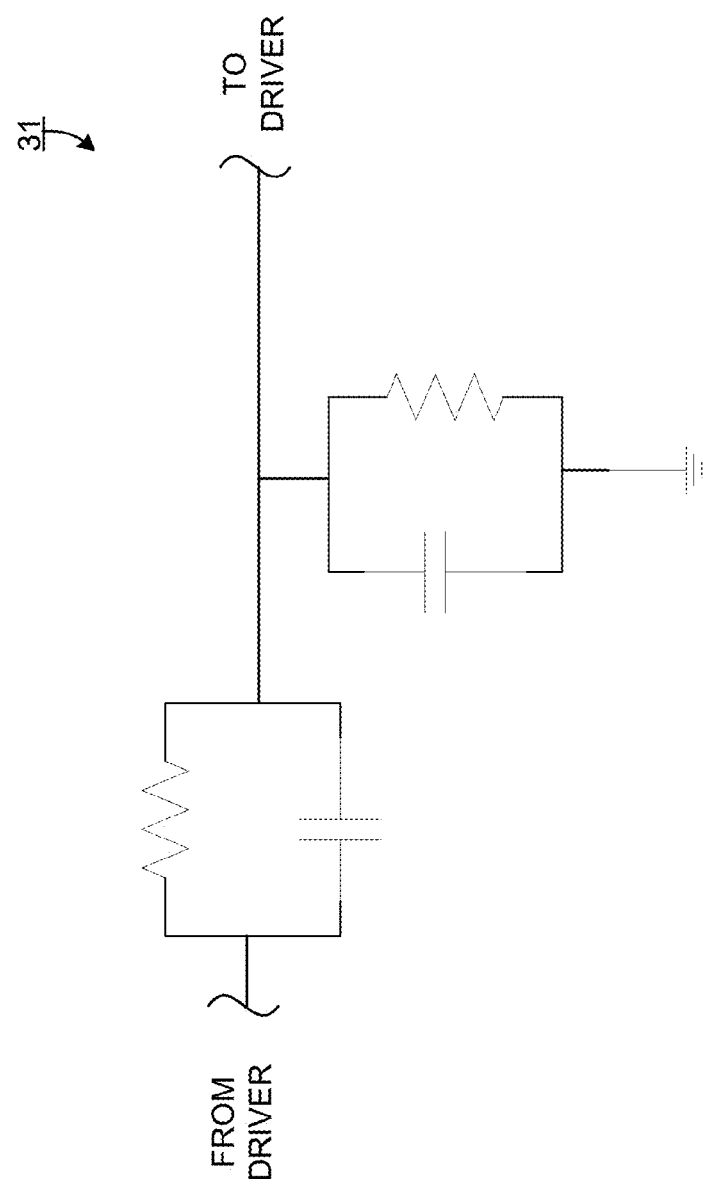
FIG. 4 shows an example of a filter in the multi-stage equalization circuit.

In some implementations, one or more of the filters in the multi-stage equalization circuitry may be a high-pass compensation filter; however, other types of filters and/or circuits may be employed. FIG. 4 shows an example of such a filter 31, with connection to its corresponding preceding driver and to a succeeding driver of a next stage. In some implementations, there may be more than one filter in between different stages of the multi-stage equalization circuit. In some implementations, some intermediate stages of the multi-stage equalization circuit may not include filters. For example, in FIG. 1, in an example implementation, filter 18 may be removed from stage 2 between drivers 12 and 13.

Figure 5:
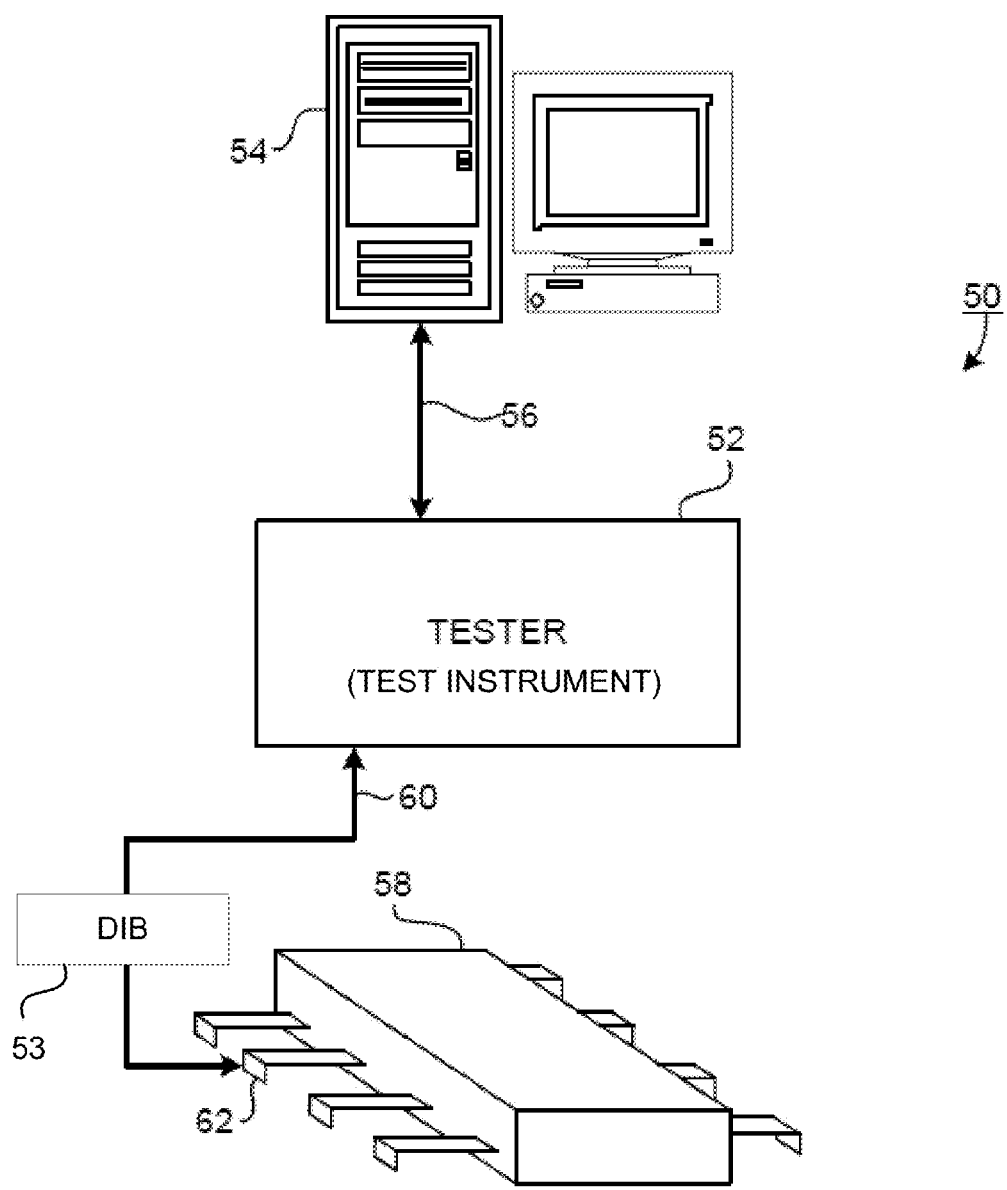
FIG. 5 shows example ATE that includes a test instrument.

As noted above, interface 10 may be part of a DIB that interfaces between a DUT and ATE. Referring to FIG. 5, an example ATE system 50 includes a DIB 53 which includes a multi-stage equalization circuit of the type described above with respect to FIGS. 1 to 4. ATE system 50 is for testing a DUT 58, such as a semiconductor device, and includes a tester (or "test instrument") 52.

Tester 52 may include a number of channels, over which signals can be sent. To control tester 52, system 50 includes a computer system 54 that interfaces with tester 52 over a hardwire connection 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. For example, DUTs may be semiconductor devices such as an integrated circuit (IC) chip (e.g., memory chip, microprocessor, analog-to-digital converter, digital-to-analog converter, etc.) or other devices.

To provide test signals and collect responses from the DUT, tester 52 is connected to a DIB 53 having a multi-stage equalization interface circuit of the type described herein (e.g., interface 10). In this example, interface 10 connects between tester 52 and the internal circuitry of DUT 58. For example, the DUT may be inserted into a socket of a DIB 53 containing interface 10, which enables electrical connection between the DUT and the tester. For example, a conductor 60 (e.g., one or more conductive pathways) is connected to the interface and is used to deliver test signals (e.g., switching or DC test signals, etc.), via interface 10, to the internal circuitry of DUT 58. The ATE may also sense signals, via interface 10, in response to the test signals provided by tester 52. For example, a voltage signal or a current signal may be sensed. Such single port tests may also be performed on other pins included in DUT 58. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60, via interface 10, to pin 62 for storing a digital value on DUT 58. Once stored, DUT 58 may be accessed to retrieve and send the stored digital value, via interface 10, over conductor 60, ultimately to tester 52. The retrieved digital value may then be identified to determine if the proper value was stored on DUT 58.

Along with performing single port measurements, a two-port or multi-port test may also be performed by tester 52. For example, a test signal may be injected over conductor 60, via interface 10, into pin 62 and a response signal may be collected from one or more other pins of DUT 58 via interface 10. This response signal may be provided to tester 52 to determine quantities, such as gain response, phase response, and other throughput measurement quantities.

Figure 6:
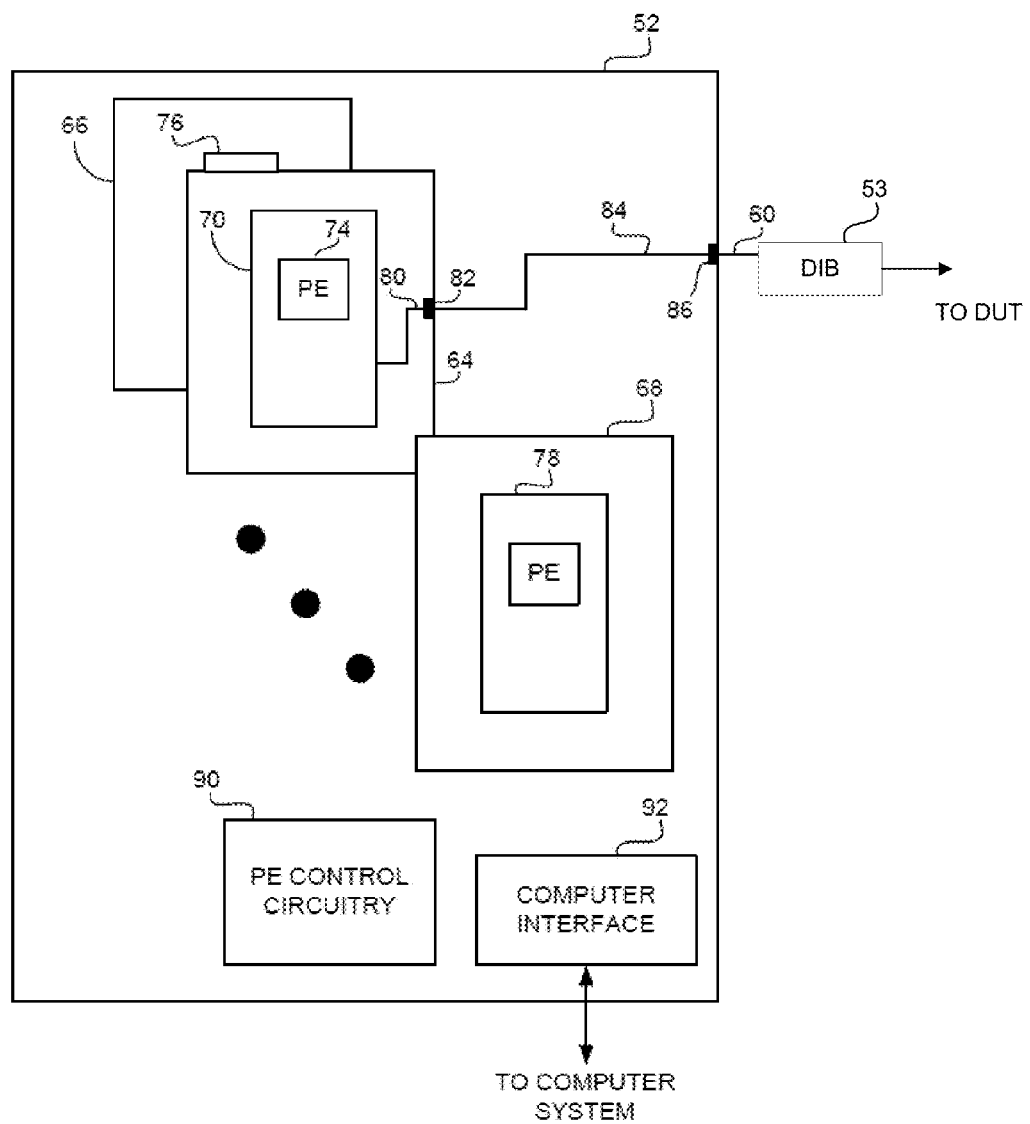
FIG. 6 is a block diagram of an example test instrument.

Referring also to FIG. 6, to send and collect test signals from multiple connector pins of a DUT (or multiple DUTs), tester 52 includes an interface card 64 that can communicate with numerous pins. For example, interface card 64 may transmit test signals to, e.g., 32, 64, or 528 pins and collect corresponding responses. Each communication link to a pin corresponds to a channel such as that shown in FIG. 2 and, by providing test signals to a number of channels, testing time is reduced since multiple tests may be performed simultaneously. Along with having many channels on an interface card, by including multiple interface cards in tester 52, the overall number of channels increases, thereby further reducing testing time. In this example, two additional interface cards 66 and 68 are shown to demonstrate that multiple interface cards may populate tester 52.

Each interface card includes one or more dedicated integrated circuit (IC) chips (e.g., an application specific integrated circuit (ASIC)) for performing particular test functions. For example, interface card 64 includes IC chip 70 for performing pin electronics (PE) tests. Specifically, IC chip 70 has a PE stage 74 that includes circuitry for performing PE tests. Additionally, interface cards 66 and 68 respectively include IC chips 76 and 78 that include PE circuitry. Typically, PE testing involves sending switching test signals, or digital waveforms, to a DUT (e.g., DUT 58) via interface 10, and collecting responses to further characterize the performance of the DUT. For example, IC chip 70 may transmit (to the DUT) switching test signals that represent a vector of binary values for storage on the DUT. Once these binary values have been stored, the DUT may be accessed by tester 52 to determine if the correct binary values have been stored. Since digital signals typically include abrupt voltage transitions, the circuitry in PE stage 74 on IC chip 70 operates at a relatively high speed in comparison to the other test circuitry (e.g., parametric measurement unit (PMU) circuitry, which is not shown in the figures). PE testing may also involve adding jitter to test signals and observing DUT operation in the presence of the jitter.

In this example implementation, signals are passed from interface card 64 to DUT 58 via DIB 53 (and example interface 10 or another interface of the type described herein). The signals are passed via one or more conducting traces 80 connect IC chip 70 to an interface board connector 82 that allows signals to be passed on and off interface board 64. Interface board connector 82 is also connected to one or more conductors 84 that are connected to an interface connector 86, which allow signals to be passed to and from tester 52. In this example, conductor(s) 60 are connected to interface connector 86 for bi-directional signal passage between tester 52 and pins of DUT 58. Interface 10 may be used to connect one or more conductors from tester 52 to the DUT. As explained above, the DUT (e.g., DUT 58) may be mounted onto DIB 53 containing interface 10 for providing access to each DUT pin. In such an arrangement, conductor(s) 60 may be connected to the DIB for placing test signals on the appropriate pin(s) (e.g., pin 62) of the DUT.

In some implementations, conducting trace(s) 80 and conductor(s) 84 respectively connect IC chip 70 and interface board 64 for delivering and collecting signals. IC chip 70 (along with IC chips 76 and 78) may have multiple pins (e.g., eight, sixteen, etc.) that are respectively connected with multiple conducting traces and corresponding conductors for providing and collecting signals from the DUT (e.g., via a DIB). Additionally, in some implementations, tester 52 may connect to two or more DIB's for interfacing the channels provided by interface cards 64, 66, and 68 to one or multiple devices under test.

To initiate and control the testing performed by interface cards 64, 66, and 68, tester 52, PE control circuitry 90 provides test parameters (e.g., test signal voltage level, test signal current level, digital values, etc.) for producing test signals and analyzing DUT responses. The PE control circuitry may be implemented using one or more processing devices. Examples of processing devices include, but are not limited to, a microprocessor, a microcontroller, programmable logic (e.g., a field-programmable gate array), and/or combination(s) thereof. Tester 52 also includes a computer interface 92 that allows computer system 54 to control the operations executed by tester 52 and also allows data (e.g., test parameters, DUT responses, etc.) to pass between tester 52 and computer system 54.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. An apparatus for interfacing between automatic test equipment (ATE) and a device under test (DUT), the apparatus comprising:
    multiple stages arranged in sequence between the ATE and the DUT, each of the multiple stages comprising a driver, at least two of the multiple stages each comprising a filter, each filter being arranged between two drivers;
    wherein a filter in a stage among the multiple stages is configured to reduce jitter produced by a preceding driver in the stage in a signal transmitted between the ATE and the DUT, the jitter reduced by the filter corresponding to a width of the signal at a predefined crossing point at a point on a path between the ATE and the DUT; and
    wherein, reduction of jitter at each of the at least two of the multiple stages causes a reduction in overall jitter of the signal received by the DUT.

2. The apparatus of claim 1, wherein a last of the multiple stages comprises a driver but not a filter between the driver and the DUT.

3. The apparatus of claim 1, wherein a last of the multiple stages comprises a driver and a filter between the driver and the DUT.

4. The apparatus of claim 1, wherein at least two of the filters have different configurations, the different configurations resulting from different corrections required for reduction of jitter.

5. The apparatus of claim 1, wherein at least one of the filters comprises a high-pass compensation filter.

6. The apparatus of claim 1, wherein at least one of the drivers comprises an AND gate or a splitter.

7. An apparatus for interfacing between automatic test equipment (ATE) and a device under test (DUT), the apparatus comprising:
    a first stage comprising a first driver and a first filter, the first driver for receiving an initial signal based on an output of the ATE, the first driver for outputting a first output signal based on the initial signal, the first filter for receiving the first output signal from the first driver and for performing a first equalization on the first output signal to produce a first stage signal, the first equalization reducing jitter from the initial signal by affecting a width of the first output signal at a predefined crossing point at a point on a path between the ATE and the DUT;
    a second stage comprising a second driver and a second filter, the second driver for receiving the first stage signal and for outputting a second output signal based on the first stage signal, the second filter for receiving the second output signal from the second driver and for performing a second equalization on the second output signal to produce a second stage signal, the second equalization reducing jitter from the first stage signal by affecting a width of the second output signal at a predefined crossing point at a point on the path between the ATE and the DUT; and
    a third stage comprising a third driver, the third driver for receiving the second stage signal and for outputting a third output signal based on the second stage signal, the third output signal being output on a path to the DUT;
    wherein reducing jitter from the initial signal and reducing jitter from the first stage signal reduces an overall amount of jitter in the third output signal.

8. The apparatus of claim 7, wherein the third stage comprises a third filter on the path to the DUT, the third filter for receiving the third output signal from the third driver and for performing an equalization on the third output signal to produce a third stage signal; and
    a fourth stage comprising a fourth driver, the fourth driver for receiving the third stage signal and for outputting a fourth output signal based on the third stage signal, the fourth output signal being output on a path to the DUT.

9. The apparatus of claim 8, wherein the fourth stage comprises a fourth filter on the path to the DUT, the fourth filter for receiving the fourth output signal from the fourth driver and for performing an equalization on the fourth output signal to produce a fourth stage signal; and
    a fifth stage comprising a fifth driver, the fifth driver for receiving the fourth stage signal and for outputting a fifth output signal based on the fourth stage signal, the fifth output signal being output on a path to the DUT.

10. The apparatus of claim 9, wherein the fifth stage comprises a fifth filter between the fifth stage and the DUT, the fifth filter for receiving the fifth output signal from the fifth driver and for performing an equalization on the fifth output signal to produce a fifth stage signal that is provided to the DUT.

11. The apparatus of claim 9, wherein the first filter is configured to correct for jitter produced by the first driver by reducing the width of the first output signal, the second filter is configured to correct for jitter produced by the second driver by reducing the width of the second output signal, the third filter is configured to correct for jitter produced by the third driver, and the fourth filter is configured to correct for jitter produced by the fourth driver; and wherein at least two of the first driver, the second driver, the third driver, and the fourth driver have different configurations.

12. The apparatus of claim 9, wherein there is no filter between the fifth driver and the DUT.

13. The apparatus of claim 7, wherein there is no filter between the third driver and the DUT.

14. The apparatus of claim 7, wherein the first filter is configured to correct for jitter produced by the first driver and the second filter is configured to correct for jitter produced by the second driver.

15. The apparatus of claim 7, wherein at least one of the first filter and the second filter comprises a high-pass compensation filter.

16. The apparatus of claim 7, wherein the first driver comprises an AND gate or a splitter, and the second driver comprises an AND gate or a splitter.

17. A test system comprising:

automatic test equipment (ATE) to output test signals to a device under test (DUT); and an interface between the ATE and the DUT, the interface comprising stages, the stages comprising drivers arranged in sequence and filters arranged among the drivers, the stages to perform multi-stage equalization on test signals output from the ATE to the DUT, the multi-stage equalization comprising reducing jitter on a test signal among the test signals at each stage so as to reduce an overall jitter of the test signal, the jitter at each stage being reduced by affecting a width of the test signal at a predefined crossing point.

18. The test system of claim 17, wherein the stages comprise:

multiple stages arranged in sequence between the ATE and the DUT, each of the multiple stages comprising a driver, at least two of the multiple stages each comprising a filter, each filter being arranged between two drivers;

wherein each filter is configured to reduce jitter produced by a preceding driver in the test signal.

19. The test system of claim 17, wherein a last of the multiple stages comprises a driver but not a filter between the driver and the DUT; and wherein at least two of the filters have different configurations, the different configurations resulting from different corrections required for reduction of jitter.

20. The test system of claim 17, wherein a last of the multiple stages comprises a driver but not a filter between the driver and the DUT; and wherein at least three of the filters have different configurations, the different configurations resulting from different corrections required for reduction of jitter.

* * * * *

UNITED STATES PATENT AND TRADEMARK OFFICE
CERTIFICATE OF CORRECTION

PATENT NO. : 9,772,378 B2
APPLICATION NO. : 14/471726
DATED : September 26, 2017
INVENTOR(S) : Timothy Daniel Lyons It is certified that error appears in the above-identified patent and that said Letters Patent is hereby corrected as shown below:

In the "References Cited" item (56):
Please replace --2005/0131029 A1 6/2005 Hoke et al.-- with --2005/0031029 A1 2/2005 Yamaguchi et al.--

Signed and Sealed this
Seventh Day of November, 2017

Joseph Matal
*Performing the Functions and Duties of the
Under Secretary of Commerce for Intellectual Property and
Director of the United States Patent and Trademark Office*